(12) United States Patent
Moon et al.

(10) Patent No.: US 12,010,916 B2
(45) Date of Patent: Jun. 11, 2024

(54) COMPLIANT THREE-DIMENSIONAL THERMOELECTRICS

(71) Applicant: The Board of Regents of the Nevada System of Higher Education on Behalf of the University of Nevada, Las Vegas, NV (US)

(72) Inventors: Jaeyun Moon, Henderson, NV (US); Matthew Pusko, Las Vegas, NV (US); Kaleab Ayalew, Las Vegas, NV (US); Suraj Venkat Pochampally, Las Vegas, NV (US); Hoyoung Ahn, Las Vegas, NV (US)

(73) Assignee: The Board of Regents of the Nevada System of Higher Education on Behalf of the University of Nevada, Las Vegas, NV (US)

( * ) Notice: Subject to any disclaimer, the term of this patent is extended or adjusted under 35 U.S.C. 154(b) by 303 days.

(21) Appl. No.: 17/112,586

(22) Filed: Dec. 4, 2020

(65) Prior Publication Data
US 2021/0175406 A1    Jun. 10, 2021

Related U.S. Application Data

(60) Provisional application No. 62/943,602, filed on Dec. 4, 2019.

(51) Int. Cl.
*H10N 10/01* (2023.01)
*H10N 10/17* (2023.01)
*H10N 19/00* (2023.01)

(52) U.S. Cl.
CPC .............. *H10N 10/01* (2023.02); *H10N 10/17* (2023.02); *H10N 19/101* (2023.02)

(58) Field of Classification Search
CPC ....... H01L 35/34; H01L 35/325; H10N 10/01; H10N 19/101
See application file for complete search history.

(56) References Cited

U.S. PATENT DOCUMENTS

| | | | |
|---|---|---|---|
| 2015/0280099 A1* | 10/2015 | Boukai | H10N 10/01 438/54 |
| 2017/0244019 A1* | 8/2017 | Rojas | H10N 10/852 |
| 2018/0182947 A1* | 6/2018 | Imai | H10N 10/01 |
| 2018/0294397 A1* | 10/2018 | Suzuki | H10N 10/13 |

\* cited by examiner

*Primary Examiner* — Aaron J Gray
(74) *Attorney, Agent, or Firm* — Ballard Spahr LLP

(57) ABSTRACT

The energy conversion performance, mechanical robustness, and cost associated with fabrication of a thermoelectric device may be improved by three-dimensional flexible thermoelectrics.

10 Claims, 5 Drawing Sheets

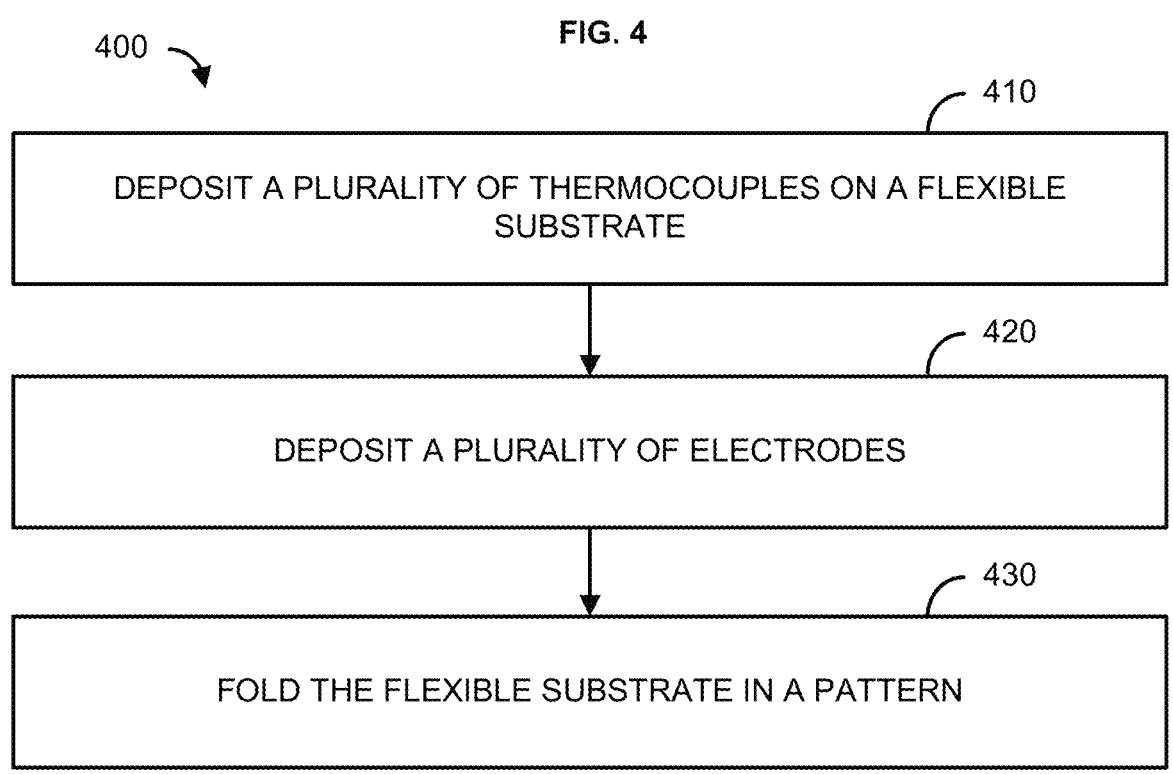

COMPLIANT THREE-DIMENSIONAL THERMOELECTRICS

CROSS-REFERENCE TO RELATED PATENT APPLICATION

This application claims priority to U.S. Provisional Application No. 62/943,602 filed Dec. 4, 2019, which is herein incorporated by reference in its entirety.

BACKGROUND

A common feature of electronics and/or electronic devices is that, when in operation, they produce heat. Heat may also be generated from a wide variety of other sources, such as a human body, power plants, and mobile vehicles. The heat generated by power plants, cars, electronics, electronic devices, organic bodies (e.g., humans), and/or the like, if unused, is known as waste heat. Waste heat is a ubiquitous energy resource. Many electrical systems and/or devices incorporate thermoelectric devices, such as Internet of Things (IoT) devices, air conditioning and HVAC systems (e.g., cooling and/or heating systems that use electric current to transfer heat), commercial power plants (e.g., wind energy plants, solar energy plants, energy plants that utilize coal/oil/natural gas, nuclear energy plants, etc.), and/or the like. Electrical systems and/or devices may incorporate thermoelectric devices to make use of waste heat by converting heat flux (e.g., temperature differences) directly into electrical energy.

Conventional thermoelectric modules/devices have a rigid planar (e.g., flat) construction/design that induces low mechanical reliability under extreme thermal stress conditions. Conventional thermoelectric modules/devices lack fault tolerance. Because the thermoelectric elements are electrically connected in series, the failure of a single element generally causes an open circuit condition in the thermoelectric module/device. An open circuit may prevent any of the elements in the thermoelectric module/device from receiving the current required to generate/produce heating and/or cooling. A single failed element can cause entire thermoelectric modules/devices to fail. Element failure within a thermoelectric module/device is often caused by thermal stress and thermal mismatch in rigid planar thermoelectric modules/devices when subjected to a large temperature gradient and repeated thermal cycling. Shear stress concentration caused by thermal expansion of hot surfaces within systems and/or devices that incorporate rigid planar thermoelectric modules/devices is a major cause of systems and/or devices malfunction. Conventional thermoelectric modules/devices are routinely associated with a high labor and fabrication cost, have limited applications due to their construction material (e.g., tellurides) and structure (e.g., planar construct, difficult to apply to curved surfaces, etc.)

SUMMARY

It is to be understood that both the following general description and the following detailed description are exemplary and explanatory only and are not restrictive. Provided are methods and systems for compliant three-dimensional thermoelectrics.

A printed planar thermoelectric module/device (e.g., a thermoelectric generator (TEG)), may be folded in a pattern (e.g., three-dimensional pattern, origami pattern, kirigami pattern, etc.) to create a three-dimensional thermoelectric structure. Flexible three-dimensional thermoelectric structures align n-type and p-type components (e.g., legs) with a natural direction of heat flow (e.g., out of plane direction). As a result, the temperature drop across the n-type and p-type components (e.g., legs) contributes to generating power.

Compliant three-dimensional thermoelectric structures may be made from flexible substrates. As such, compliant three-dimensional thermoelectric structures may bend and/or expand in different directions to allow the compliant three-dimensional thermoelectric structure to comply with any shape and to be used to harness energy from oblique objects (e.g., non-flat surfaces, etc.) that produce heat, such as an exhaust manifold, brake calipers, rounded heat-pipes, body curvatures (e.g., wearable three-dimensional thermoelectric structures within garments/clothes), and/or the like.

Compliant three-dimensional thermoelectric structures may prevent and/or inhibit shear stress concentration caused by thermal expansion of hot surfaces and/or hot sides of the device.

Additional advantages will be set forth in part in the description which follows or may be learned by practice. The advantages will be realized and attained by means of the elements and combinations particularly pointed out in the appended claims.

BRIEF DESCRIPTION OF THE DRAWINGS

The accompanying drawings, which are incorporated in and constitute a part of this specification, illustrate embodiments and together with the description, serve to explain the principles of the methods and systems for flexible three-dimensional thermoelectrics:

FIG. 4 is a flowchart of an example method for a compliant three-dimensional thermoelectric device.

DETAILED DESCRIPTION

Figure 1A:
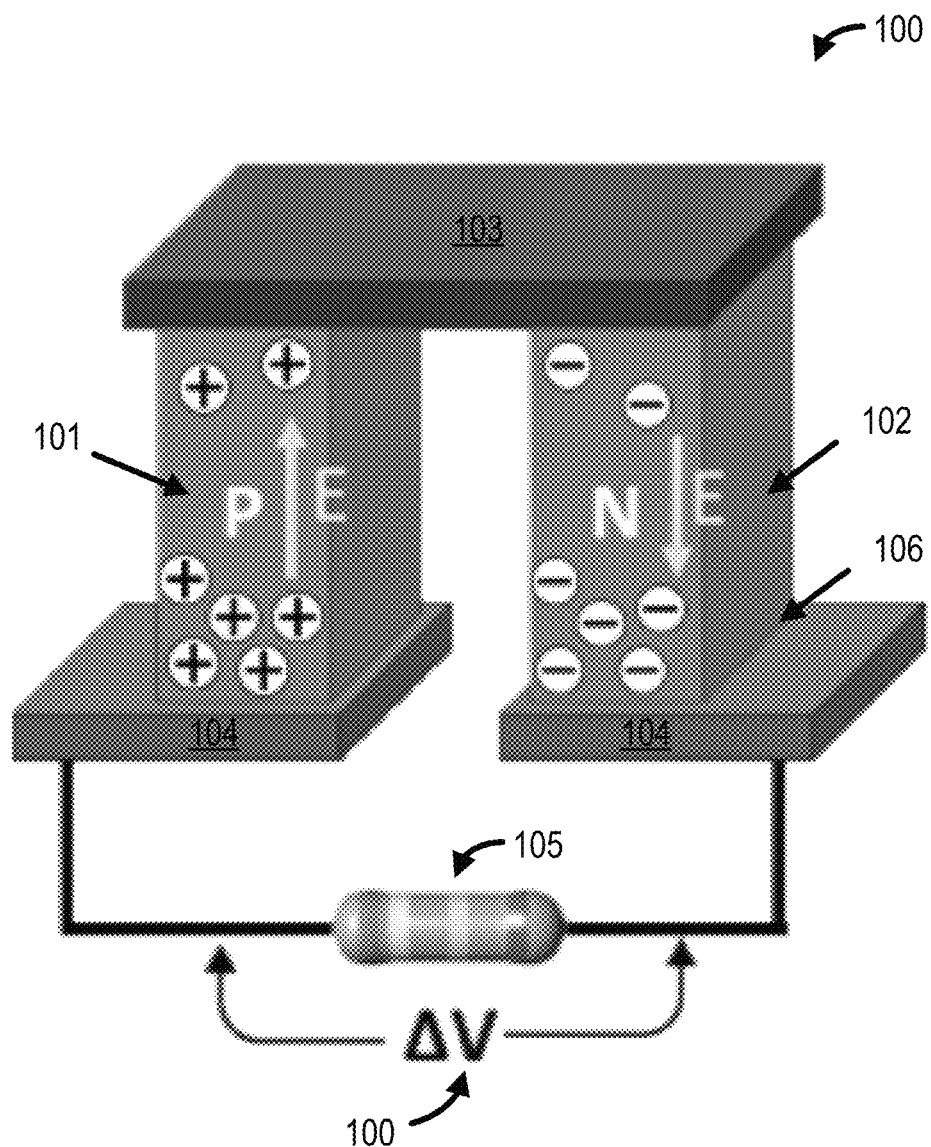
FIG. 1A is an example thermoelectric device.

Before the present methods and systems are disclosed and described, it is to be understood that the methods and systems are not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the examples included therein and to the Figures and their previous and following description.

As will be appreciated by one skilled in the art, the methods and systems may take the form of an entirely hardware embodiment, an entirely software embodiment, or an embodiment combining software and hardware aspects.

Furthermore, the methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks, CD-ROMs, optical storage devices, or magnetic storage devices.

Embodiments of the methods and systems are described below with reference to block diagrams and flowchart illustrations of methods, systems, apparatuses, and computer program products. It will be understood that each block of the block diagrams and flowchart illustrations, and combinations of blocks in the block diagrams and flowchart illustrations, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

Note that in various instances this detailed disclosure may refer to a given entity performing some action. It should be understood that this language may in some cases mean that a system (e.g., a computer) owned and/or controlled by the given entity is actually performing the action.

Method and systems for compliant three-dimensional thermoelectrics are described. Origami and kirigami are the Japanese art of paper folding and cutting to create different geometries. Origami techniques, kirigami techniques, and/or the like may be used to convert two-dimensional sheets into three-dimensional structures. Origami techniques, kirigami techniques, and/or the like may be used to form a three-dimensional thermoelectric module/device (e.g., a thermoelectric generator (TEG) from a thermoelectric module/device.

A printed planar thermoelectric module/device (e.g., a thermoelectric generator (TEG)), may be folded and/or constructed in a pattern (e.g., three-dimensional pattern, origami pattern, kirigami pattern, etc.) to create a three-dimensional thermoelectric structure. Three-dimensional thermoelectric structures align n-type and p-type components (e.g., legs) with a natural direction of heat flow. As a result, the temperature drop across the n-type and p-type components (e.g., legs) contributes to generating power.

Compliant three-dimensional thermoelectric structures may be made from flexible substrates. As such, compliant three-dimensional thermoelectric structures may bend and/or expand in different directions to comply with any shape and to allow the three-dimensional thermoelectric structure to be used to harness energy from oblique objects (e.g., non-flat surfaces, etc.) that produce heat, such as an exhaust manifold, brake calipers, body curvatures (e.g., wearable flexible three-dimensional thermoelectric structures within garments/clothes), and/or the like.

Compliant three-dimensional thermoelectric structures may prevent and/or inhibit shear stress concentration caused by thermal expansion of hot surfaces and/or hot sides of the device.

Figure 1B:
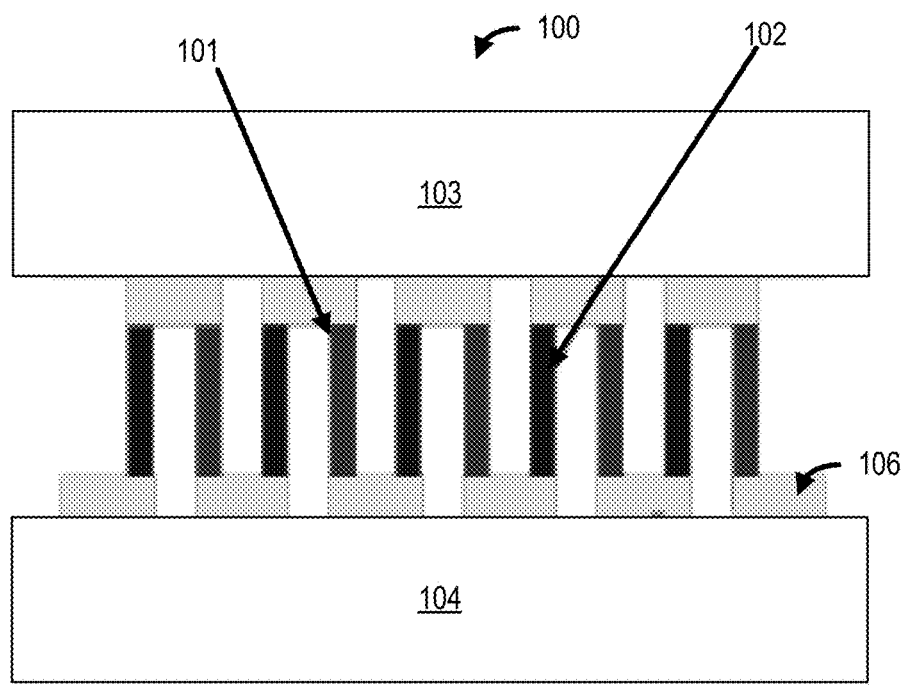
FIG. 1B is an example thermoelectric device.
Figure 1C:
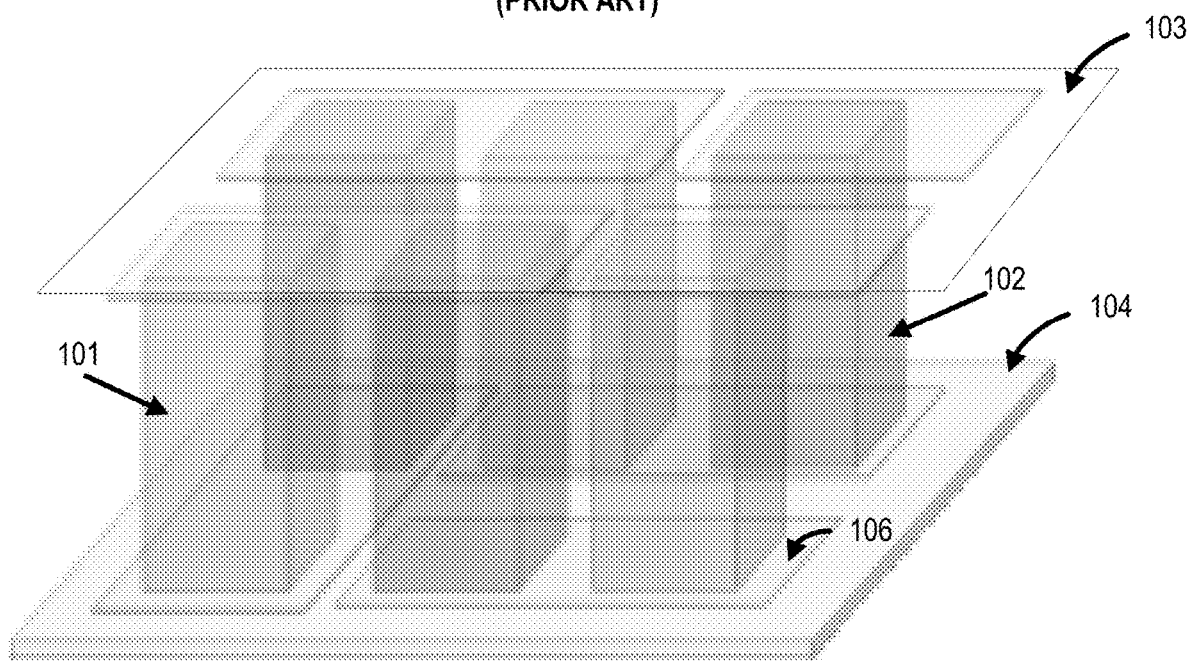
FIG. 1C is an example thermoelectric device.

FIGS. 1A, 1B, and 1C illustrate a conventional thermoelectric module/device (e.g., a thermoelectric generator (TEG)) 100. A conventional thermoelectric module/device (e.g., a thermoelectric generator (TEG)) 100 may contain thermoelectric materials that generate electricity from heat directly. A conventional thermoelectric module/device (e.g., a thermoelectric generator (TEG)) 100 may consist of two dissimilar thermoelectric materials 101 and 102 joined at their ends to create thermocouples. Thermoelectric material 101 may be an n-type (e.g., with negative charge carriers, Seebeck coefficients, etc.) material/semiconductor. Thermoelectric material 102 may be a p-type (with positive charge carriers, Seebeck coefficients, etc.) material/semiconductor. The thermoelectric materials 101 and 102 may be between plate 103 (e.g., an upper plate, ceramic plate, etc.) and plate 104 (e.g., a lower plate, ceramic plate, etc.). The plates 103 and 104 may have high electrical resistivity (e.g., electrically insulating) and low thermal conductivity. The plates 103 and 104 may have different temperatures. For example, plate 103 may be a relatively cold plate and plate 104 may be a relatively hot plate. Between the plates are a number of Peltier couples, formed by using a conductive material 106 (e.g., electrodes, metal connectors, conductive ink, etc.) to join thermoelectric materials 101 and 102 to the plates 103 and 104. Thermoelectric materials (e.g., thermoelectric materials 101 and 102) may be arranged in an alternating p-type and n-type semiconductor elements configuration, with the thermoelectric materials 101 and 102 coupled electrically in series and thermally in parallel in the heat flow direction (e.g., from plate 103 to 104). The thermoelectric materials 101 and 102 may be connected in series by a resistive element 105 (e.g., load resistor, etc.).

The thermoelectric module/device (e.g., a thermoelectric generator (TEG)) 100 may produce an electric current when there is a temperature difference along the thermoelectric materials 101 and 102 (e.g., between the plates 103 and 104, etc.). The direction of heat transfer may be indicated by the direction of net current flow through the thermoelectric materials 101 and 102. If the resistive element 105 is replaced with a voltmeter, the thermoelectric module/device may function as a temperature-sensing thermocouple. FIG. 1B is a two-dimensional illustration of the thermoelectric module/device (e.g., a thermoelectric generator (TEG)) 100. FIG. 1C is a three-dimensional illustration of the thermoelectric module/device (e.g., a thermoelectric generator (TEG)) 100.

Figure 2A:
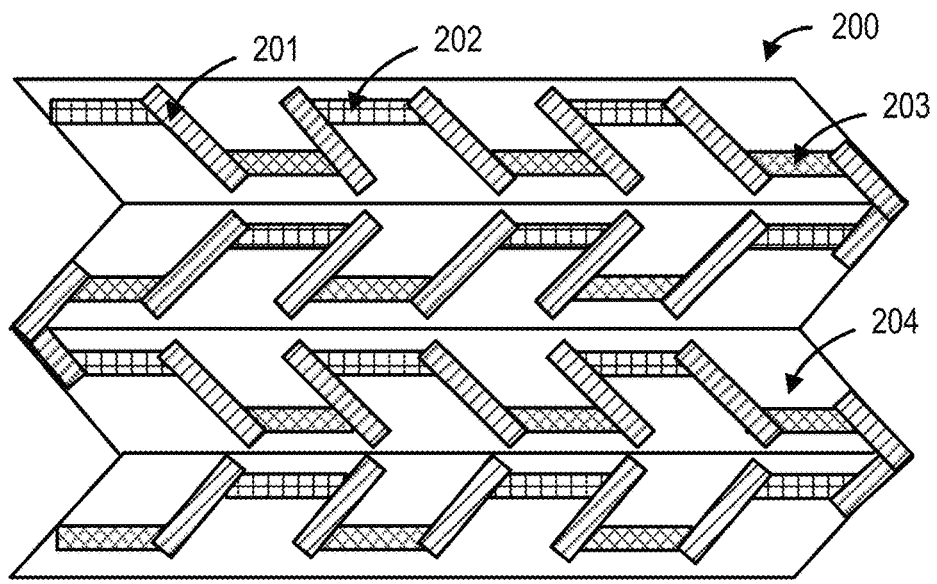
FIG. 2A is an example of a compliant three-dimensional thermoelectric device.
Figure 2B:
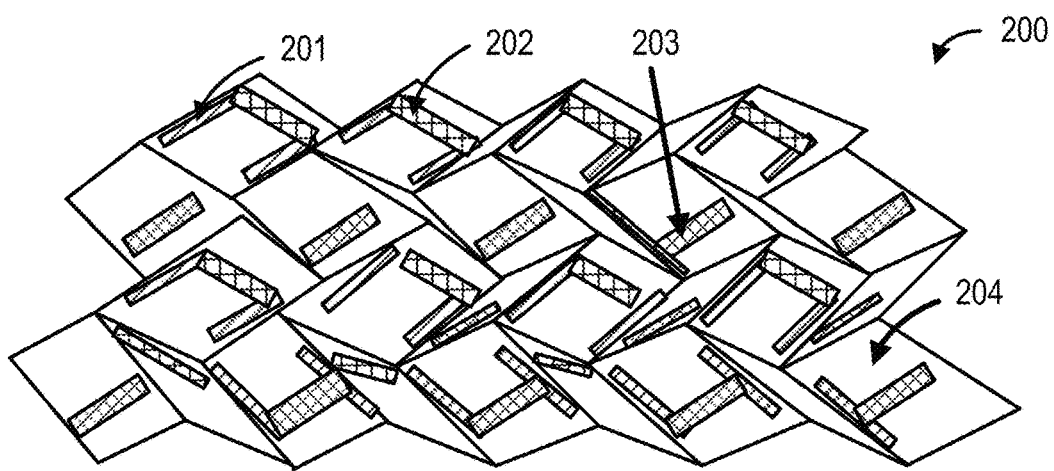
FIG. 2B is an example of a compliant three-dimensional thermoelectric device.
Figure 2C:
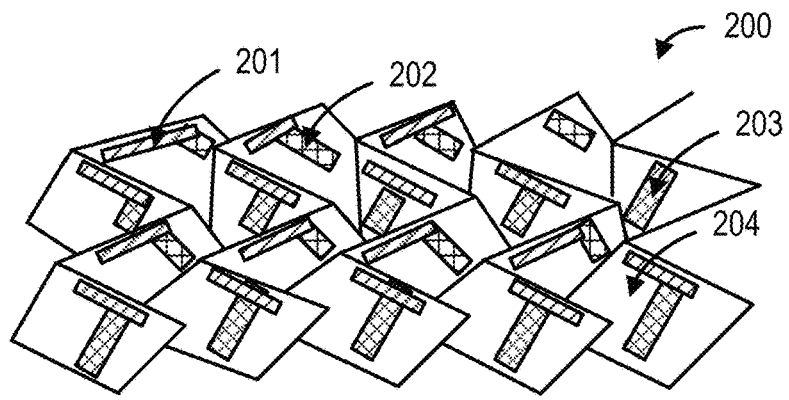
FIG. 2C is an example of a compliant three-dimensional thermoelectric device.

FIGS. 2A, 2B, and 2C illustrate a compliant three-dimensional thermoelectric module/device (e.g., a thermoelectric generator (TEG)) 200.

The compliant three-dimensional thermoelectric module/device (e.g., a thermoelectric generator (TEG)) 200, may include multiple dissimilar thermoelectric strips (e.g., semiconductor materials, legs, etc.) 202 and 203 electronically connected via conductive material 201 (e.g., an electrode, conductive ink, gold (Au), aluminum (Al), copper (Cu), conductive alloys, etc.) to create a plurality of thermocouples printed on a flexible substrate 204. The thermoelectric strips 202 may be p-type thermoelectric strips (e.g., semiconductor strips/material for which electrical conduction is due chiefly to the movement of positive holes), and thermoelectric strips 203 may be n-type thermoelectric strips (e.g., semiconductor strips/material for which electrical conduction is due chiefly to the movement of electrons). The thermoelectric strips 202 and 203 may be made from inorganic thermoelectric materials (e.g., bismuth telluride ($Bi_2Te_3$), antimony telluride ($Sb_2Te_3$), etc.) for harvesting low-grade heat (e.g., low temperature). In some instances, the thermoelectric strips 202 and 203 may be made from organic thermoelectric materials. The thermoelectric strips 202 and 203 may be made from any material. The material used for the thermoelectric strips 202 and 203 may be based on the application of the compliant three-dimensional thermoelectric module/device 200. For example, the material used for the thermoelectric strips 202 and 203 may be based on the figure of merit (ZT) desired and/or required for the thermoelectric strips 202 and 203.

The thermoelectric strips 202 and 203 may be deposited on a flexible material/substrate 204 (e.g., paper, fabric, polyester paper/film, polyether material, polyimide films, etc.). For example, the thermoelectric strips 202 and 203 may be deposited on the flexible material/substrate 204 by physical vapor deposition (PVD), and magnetron sputtering as well as low-cost fabrication processes such as spraying and screen printing. The thermoelectric strips 202 and 203 may be deposited on the flexible material/substrate 204 by any method.

The thermoelectric strips 202 and 203 may be connected with a conductive material 201 (e.g., an electrode, conductive ink, gold (Au), aluminum (Al), copper (Cu), conductive alloys, etc.) at their ends to form thermocouples. The compliant three-dimensional thermoelectric module/device 200 may include a plurality of thermocouples. A plurality of thermocouples may be connected in series with a conductive material (e.g., an electrode, conductive ink, gold (Au), aluminum (Al), copper (Cu), conductive alloys, etc.).

FIGS. 2B and 2C illustrate that the compliant three-dimensional thermoelectric module/device 200 (e.g. FIG. 2A) may be constructed in a pattern (e.g., three-dimensional pattern, origami pattern, kirigami pattern, accordion pattern, fan pattern, etc.) to create a three-dimensional thermoelectric structure that may be compressed, folded, molded, and/or the like in any formation. FIG. 2B illustrates that the compliant three-dimensional thermoelectric module/device 200 (e.g. FIG. 2A) may be folded. FIG. 2B illustrates that the compliant three-dimensional thermoelectric module/device 200 (e.g. FIG. 2A) may be stretched.

Stretching and/or folding the three-dimensional thermoelectric structures may align the thermoelectric strips 202 and 203 (e.g., the n-type and p-type components), with a natural direction of heat flow. As a result, the temperature drop across the thermoelectric strips 202 and 203 (e.g., the n-type and p-type components) may contribute to generating voltage, power, and/or the like. The power density of the compliant three-dimensional thermoelectric module/device 200 may be set and/or adjusted according to various stretching and/or folding patterns by setting and/or adjusting the distance between the thermoelectric strips 202 and 203 (e.g., the n-type and p-type components).

The compliant material/substrate 204 (e.g., paper, polyester, etc.) may enable the three-dimensional thermoelectric module/device 200 to stretch, fold, bend, and/or expand in different directions to allow the thermoelectric module/device 200 to be used to harness energy from oblique objects (e.g., non-flat surfaces, etc.) that produce heat, such as an exhaust manifold, brake calipers, body curvatures (e.g., wearable compliant three-dimensional thermoelectric structures within garments/clothes), and/or the like. The design of the thermoelectric module/device 200 may prevent and/or inhibit shear stress concentration caused by the thermal expansion of hot surfaces and/or hot components of the thermoelectric module/device 200.

Figure 3A:
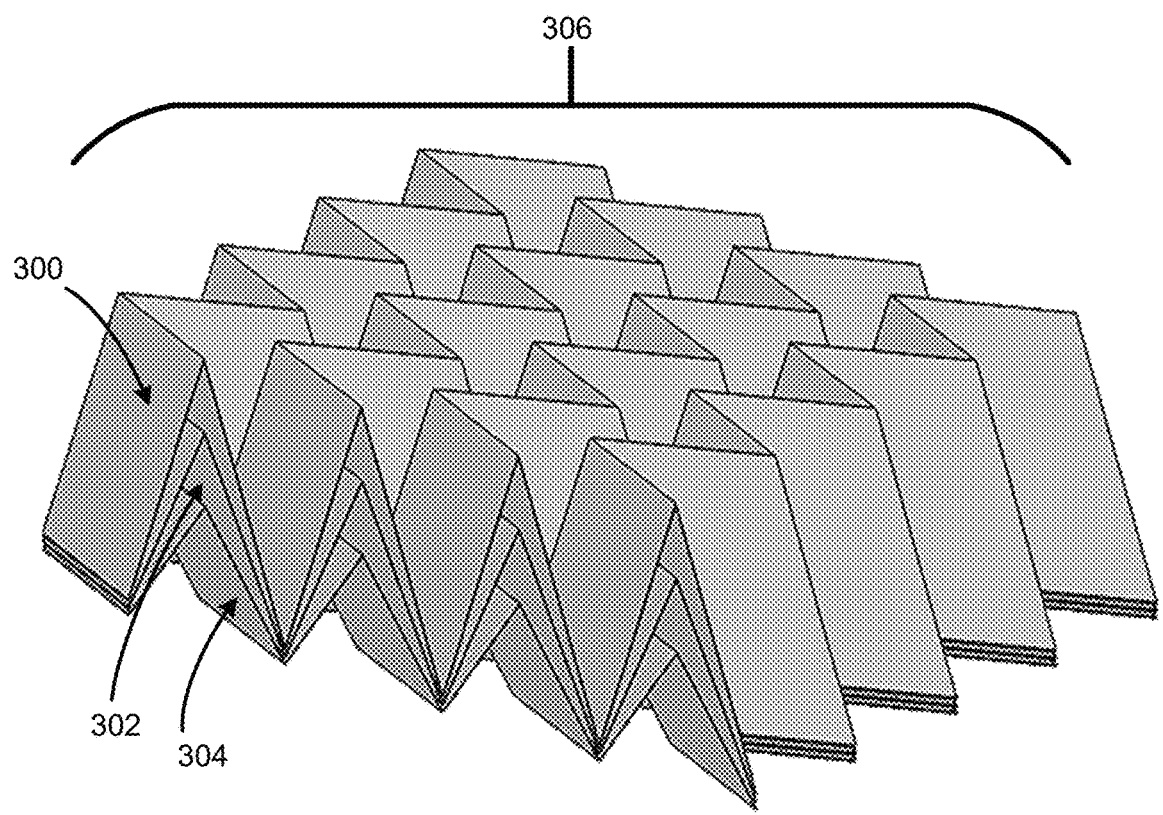
FIG. 3A is an example of a compliant three-dimensional thermoelectric device.
Figure 3B:
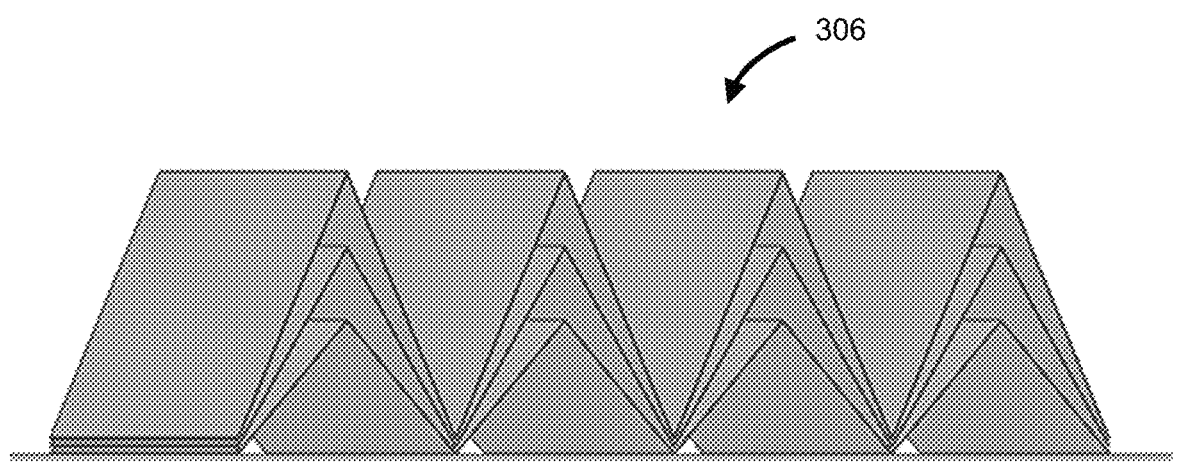
FIG. 3B is an example of a compliant three-dimensional thermoelectric device.

In some instances, multiple compliant three-dimensional thermoelectric module/devices (e.g. the compliant three-dimensional thermoelectric module/device 200, etc.) may be constructed/folded in a pattern (e.g., three-dimensional pattern, origami pattern, kirigami pattern, accordion pattern, fan pattern, etc.) and stacked together to induce a power density that is greater than a single compliant three-dimensional thermoelectric module/devices. FIG. 3A illustrates that multiple compliant three-dimensional thermoelectric module/devices 300, 302, 304 may be constructed in a pattern to create a compliant three-dimensional thermoelectric structure 306 that may be stretched, folded, molded, and/or the like in any formation. The power density of the compliant three-dimensional thermoelectric structure 306 may be set and/or adjusted according to various stretching and/or folding patterns by setting and/or adjusting the distance between thermoelectric strips (e.g., n-type and p-type components) included with the compliant three-dimensional thermoelectric structure 306. The compliant three-dimensional thermoelectric structure 306 may have an increased power density relative to each of the compliant three-dimensional thermoelectric module/devices 300, 302, 304 alone. FIG. 3B illustrates a side view of the compliant three-dimensional thermoelectric structure 306.

FIG. 4 shows a flowchart of a method 400 for compliant three-dimensional thermoelectrics. At 410, a plurality of thermocouples may be deposited on a multi-shape compliant, flexible, and/or foldable substrate to create a thermoelectric generator. For example, multiple instances of dissimilar material (e.g., thermoelectric strips, semiconductor materials, legs, etc.) may be deposited on a flexible (e.g., multi-shape compliant, foldable, etc.) substrate via physical vapor deposition (PVD) magnetron sputtering. The multiple instances of dissimilar material (e.g., thermoelectric strips, semiconductor materials, legs, etc.) may be deposited on the flexible substrate via any method. The plurality of thermocouples may be made from doped inorganic material (e.g., n-type, p-type, etc.). In some instances, the plurality of thermocouples may be made from organic materials. The plurality of thermocouples may be made from any material. The flexible substrate may include paper, fabric, polyester paper/film, polyether material, polyimide films, and or the like. The flexible substrate may include any material.

At 420, a plurality of electrodes may be deposited on the flexible (e.g., multi-shape compliant, foldable, etc.) substrate. The plurality of electrodes may be deposited on the flexible substrate via any method. Electrodes of the plurality of electrodes may be deposited on the flexible substrate so that each thermocouple of the plurality of thermocouples contacts at least two electrodes of the plurality of electrodes. Electrodes of the plurality of electrodes may be deposited on the flexible substrate so that each thermocouple of the plurality of thermocouples, based on the plurality of electrodes, is connected in series. The plurality of electrodes may include a conductive material, such as conductive ink, gold (Au), aluminum (Al), copper (Cu), conductive alloys, and/or the like. The plurality of electrodes may include any conductive material.

Each component, leg, dissimilar material, and/or the like of a thermocouple of the plurality of thermocouples may have a voltage. A voltage output of the thermoelectric generator may be the sum of the voltage across each component, leg, dissimilar material, and/or the like of a thermocouple of the plurality of thermocouples. The voltage generated by a thermocouple of the plurality of thermocouples may be a function of a temperature difference between conductive materials on each side of the flexible (e.g., multi-shape compliant, foldable, etc.) substrate. For example, one area of the flexible substrate may be at a first temperate and another area of the flexible substrate may be at a different temperature. Based on the difference in temperature between the different areas of the flexible substrate, each component, leg, dissimilar material, and/or the like of a thermocouple of the plurality of thermocouples may generate a voltage. Because each component, leg, dissimilar material, and/or the like of a thermocouple of the plurality of thermocouples is connected in series and because each thermocouple of the plurality of thermocouples is connected in series, the overall total voltage output of the thermoelectric generator may be the sum of the voltage across each component, leg, dissimilar material, and/or the like of a thermocouple of the plurality of thermocouples.

At 430, the flexible (e.g., multi-shape compliant, foldable, etc.) substrate may be folded. The flexible substrate may be folded in a pattern. The pattern may include an origami pattern, a kirigami pattern, an accordion pattern, or a fan pattern. The pattern may include any pattern. The flexible substrate may be folded in a pattern to obtain a desired power density and/or maximum achievable temperature gradient by adjusting the distance between thermocouples. In some instances, the flexible substrate may be stretched to adjust the power density and/or maximum achievable temperature gradient by adjusting the distance between thermocouples. In some instances, the flexible substrate may be stacked on another flexible substrate and the total power density and/or maximum achievable temperature gradient may be increased (relative to a single flexible substrate) by adjusting the distance between thermocouples.

The following examples are put forth to provide those of ordinary skill in the art with a complete disclosure and description of how the compounds, compositions, articles, devices, and/or methods claimed herein are made and evaluated, and are intended to be purely exemplary and are not intended to limit the scope of the methods and systems. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

The methods and systems can employ Artificial Intelligence techniques such as machine learning and iterative learning. Examples of such techniques include, but are not limited to, expert systems, case based reasoning, Bayesian networks, behavior based AI, neural networks, fuzzy systems, evolutionary computation (e.g. genetic algorithms), swarm intelligence (e.g. ant algorithms), and hybrid intelligent systems (e.g. Expert inference rules generated through a neural network or production rules from statistical learning).

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications are referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A method, comprising:
  depositing a plurality of thermocouples on a flexible substrate;
  depositing a plurality of electrodes on the flexible substrate, wherein each thermocouple of the plurality of thermocouples contacts at least two electrodes of the plurality of electrodes, wherein each thermocouple of the plurality of thermocouples, based on the plurality of electrodes, is connected in series;
  folding the flexible substrate in a three-dimensional pattern having a first crease extending parallel to a first direction and second crease extending parallel to a second direction different than the first direction causing, based on folding the flexible substrate, a distance between the plurality of thermocouples to be adjusted;
  stacking the folded flexible substrate on another folded flexible substrate; and
  attaching the folded flexible substrate stacked on the another folded flexible substrate to an oblique object, the folded flexible substrate preventing sheer stress concentration.

2. The method of claim 1 further comprising adjusting, based on the three-dimensional pattern, a power density, wherein the power density is based on power generated by the plurality of thermocouples.

3. The method of claim 1 further comprising adjusting, based on the three-dimensional pattern, a temperature gradient of the flexible substrate.

4. The method of claim 1, wherein the flexible substrate comprises one or more of paper or fabric.

5. The method of claim 1, wherein the plurality of thermocouples comprise one or more of inorganic material or organic material.

6. The method of claim 1, wherein depositing the plurality of thermocouples comprises physical vapor deposition (PVD) magnetron sputtering.

7. The method of claim 1, wherein the oblique object produces heat.

8. The method of claim 7, further comprising generating, based on the heat, power.

9. The method of claim 1, wherein the three-dimensional pattern is based on one or more of an origami pattern, a kirigami pattern, an accordion pattern, or a fan pattern.

10. The method of claim 1, wherein stacking the folded flexible substrate on the another folded flexible substrate causes one or more of a change in a power density or a change in a temperature gradient.

* * * * *